United States Patent
Cho

(10) Patent No.: US 6,319,769 B1
(45) Date of Patent: Nov. 20, 2001

(54) CAPACITOR IN A SEMICONDUCTOR DEVICE AND A FABRICATING METHOD THEREOF

(75) Inventor: Bok-Won Cho, Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/487,796

(22) Filed: Jan. 20, 2000

(30) Foreign Application Priority Data

Jan. 29, 1999 (KR) .................................................. 99-2875

(51) Int. Cl.[7] ......................... H01L 21/8242; H01L 21/20
(52) U.S. Cl. ......................... 438/255; 438/240; 438/256; 438/398
(58) Field of Search ................................. 438/240, 255, 438/256, 398, 964

(56) References Cited

U.S. PATENT DOCUMENTS

| | | | |
|---|---|---|---|
| 5,486,488 * | 1/1996 | Kamiyama | 437/60 |
| 5,639,316 * | 6/1997 | Cabral, Jr. et al. | 148/277 |
| 5,696,018 * | 12/1997 | Summerfelt et al. | 437/60 |
| 6,046,084 * | 4/2000 | Wei et al. | 438/255 |
| 6,156,600 * | 12/2000 | Chao et al. | 438/238 |

* cited by examiner

Primary Examiner—Matthew S. Smith
Assistant Examiner—Lex H. Malsawma
(74) Attorney, Agent, or Firm—Fleshner & Kim, LLP

(57) ABSTRACT

The present invention relates to a capacitor in a semiconductor device and a fabricating method thereof. More particularly, the invention relates to a method of forming a storage electrode of a capacitor in a semiconductor device and a fabricating method thereof which provide a sufficient electric charge capacitance for a highly-integrated memory device and which reduces the step difference between cell and peripheral areas. In preferred embodiments, the storage electrode has a plurality of hemispherical protruding parts, and an electrically conductive layer formed on the protruding parts. The electrically conductive layer prevents the formation of an oxide layer between the storage electrode and a dielectric layer formed over the storage electrode.

15 Claims, 4 Drawing Sheets

CAPACITOR IN A SEMICONDUCTOR DEVICE AND A FABRICATING METHOD THEREOF

BACKGROUND OF THE INVENTION

1. Field of the Invention

The present invention relates to a semiconductor device, and more particularly, a capacitor in a semiconductor device and a fabricating method thereof.

2. Background of the Related Art

The size of cell areas is being reduced as a result of a semiconductor device's need for ultra-high integration. Thus, many techniques for increasing the capacitance of a capacitor are being developed. There are various ways of increasing the capacitance of a capacitor, such as forming a stacked or trench-type three dimensional structure, which increases a surface area of a dielectric layer.

The three dimensional stacked structure, which is easily fabricated and is suitable for mass production, increases the capacitance, and also provides immunity against alpha ($\alpha$) particles which cause information disturbance. A stacked capacitor is characterized by a doubly-stacked, fin-type or crown-type shape.

In order to form a cell during DRAM fabrication, transistors and the like are formed on a semiconductor substrate, storage and plate electrodes made of polycrystalline silicon and a dielectric layer are formed so that the dielectric layer lies between the electrodes, and metal interconnect lines are formed to connect the devices to one another.

The following related art techniques are used to increase the effective area of a capacitor for securing the capacitance of a capacitor in the limited space that is provided by a cell in a memory device.

First, the surface area of a capacitor, which is limited by design rules and structural limitations, can be increased by forming a storage electrode with a surface that has a rugged morphology. After a box-type storage electrode has been defined, a plurality of Hemispherical Silicon Grains (hereinafter abbreviated HSG) are formed on the surface of the storage electrode.

Second, the capacitance can be increased by forming a dielectric layer with a dielectric substance that has a relatively large dielectric constant, such as $Ta_2O_5$, $BST(Ba_1Sr_{1-x}TiO_3)$ or the like.

It would be desirable to combine the first and second techniques discussed above in order to secure the capacitance of a capacitor. Unfortunately, if a capacitor is formed with a dielectric layer of $Ta_2O_5$ between a storage electrode of silicon and a plate electrode of metal such as TiN, which is called a metal-insulator-semiconductor (MIS) structure, the capacitance of the capacitor is reduced due to the increased thickness of the dielectric layer. The dielectric layer becomes thicker because an interface layer of Si—O—N is formed at the interface between the $Ta_2O_5$ layer and the silicon layer. The capacitance of the capacitor is reduced because the capacitance is proportional to the surface area of a dielectric layer, but inversely proportional to the thickness of the dielectric layer. Thus, when a storage electrode having hemispherical protruding parts is formed with silicon, and a dielectric layer is formed with $Ta_2O_5$, it is hard to attain the intrinsic dielectric constant of the $Ta_2O_5$ layer because to a new insulating layer, such as an oxide layer, is generated at a later step.

Another structure that allows the capacitance of a capacitor to be maximized is a MIM (metal-insulator-metal) structure, which uses metal for the storage electrode. The storage electrode is typically formed with W, WN, $RuO_2$ and the like.

However, a problem with the MIM structure is that it causes a large step difference between the cell area and the peripheral area as the height of the storage electrode of a conventional crown type or a stacked-flat type is increased due to the reduced capacitor area used in next-generation devices versus 256M DRAM.

FIG. 1 to FIG. 3 show cross-sectional views of fabrication steps for a related art method of fabricating a semiconductor device. Referring to FIG. 1, an impurity region 11, used as a source or drain region, is formed by heavily doping a predetermined portion of a p-type semiconductor silicon substrate 10 with n-type impurities, such as As, P or the like.

A silicon oxide insulating interlayer 12 is formed on the silicon substrate 10 by chemical vapor deposition (hereinafter abbreviated CVD). A contact hole that exposes a surface of the impurity region 11 is formed by removing a portion of the insulating interlayer 12 by photolithography. A conductive layer of W is formed on the insulating interlayer 12 by CVD to fill up the contact hole. A conductive plug 13, which is connected electrically to the impurity region 11 and fills up the contact hole, is formed by etching back the conductive layer of W until a surface of the insulating interlayer 12 is exposed.

A polycrystalline silicon layer doped with impurities is deposited on the insulating interlayer 12, including an exposed surface of the plug 13, by CVD. Then, a storage electrode 14 is formed by patterning the polycrystalline silicon layer by photolithography and dry etching. In this case, the storage electrode 14 may be patterned into one of various shapes, such as a box, crown, cylinder, fin and the like.

Referring to FIG. 2, a plurality of hemispherical protruding parts 15 are selectively formed by carrying out a HSG formation step on an exposed surface of the storage electrode 14 using $SiH_4$ gas. As a result, a final storage electrode 14 and 15 is attained by the storage electrode 14 and the protruding parts 15. The hemispherical protruding parts 15 are typically formed by flowing $SiH_4$ gas over the storage electrode 14 under the condition of a vacuum state that ranges from 1.0E(–7) to 5.0E(–8) Torr. This technique results in the deposition of hemispherical grains of polycrystalline silicon 15 on the storage electrode 14. A surface of the final storage electrode 14 and 15 is treated by rapid thermal nitrization (hereinafter abbreviated RTN) under $NH_3$ ambience to improve the surface characteristics of the polycrystalline silicon 14. In this case, a thin nitride film 10 Å thick (not shown) is formed on the silicon layer to prevent leakage current.

A dielectric layer 16 is formed by depositing $Ta_2O_5$, which has an excellent dielectric constant, on the final storage electrode 14 and 15 on which the nitride film is formed. Then, the characteristics of the dielectric layer 16 are improved by annealing the dielectric layer under oxygen ambience. This is done because the dielectric layer 16, which consists of $Ta_2O_{5-x}$, needs to be saturated into $Ta_2O_5$ to provide an ideal dielectric constant. Unfortuntley, the annealing step can cause formation of an Si—O—N layer between the storage electrode 14/15 and the dielectric layer 16. In this case, as mentioned in the foregoing description, the Si—O—N layer at the interface between the silicon 14 and 15 and the $Ta_2O_5$ layer 16 ruins the characteristics of the $Ta_2O_5$ dielectric layer 16.

Referring to FIG. 3, a plate electrode of metal 17 is formed by depositing TiN on the insulating layer 12, including a surface of the dielectric layer 16, thereby completing the fabrication of a capacitor. However, the method of fabricating a capacitor according to the related art has difficulty in forming a crown type storage electrode on which a dielectric layer of $Ta_2O_5$ is formed due to dimensional limitations. For example, in DRAMs that are over 256M, the cell size is less than 0.25 µm. Further, the method of the related art ruins the characteristics of the dielectric layer due to the interface layer between the silicon 14 and 15 and $Ta_2O_5$ layers 16. In addition, the height of the storage electrode is over 1.3 µm when a box-type capacitor is formed, with the MIS structure having HSG or the MIM structure having a smooth surface. Thus, a step difference between cell and logic areas in a DRAM become large, which makes later processing steps difficult.

SUMMARY OF THE INVENTION

The present invention is directed to a capacitor in a semiconductor device and a fabricating method thereof that substantially obviates one or more of the problems, limitations and disadvantages of the related art.

An object of the present invention is to provide a sufficient electric charge capacitance for a highly-integrated memory device.

Another object of the present invention is to reduce the step difference between cell and peripheral areas by forming a storage electrode which has a plurality of hemispherical protruding parts and by selectively forming an electrically-conductive layer on the protruding parts.

The present invention can also be achieved in a whole or in parts by a semiconductor substrate, an insulating layer on the semiconductor substrate wherein a contact hole is formed through the insulating layer, an electrically-conductive plug filling up the contact hole, a lower electrode on the insulating layer including a surface of the plug wherein a surface of the lower electrode is irregular, a metal layer covering the lower electrode, a dielectric layer on the metal layer, and an upper electrode on the dielectric layer.

The present invention can be further achieved in a whole or in parts by forming a contact hole by removing a portion of an insulating layer formed on a semiconductor substrate wherein the substrate has an impurity diffusion region and wherein the contact hole exposes a portion of the impurity diffusion region, forming an electrically-conductive plug filling up the contact hole wherein the plug is electrically connected to the impurity diffusion region, forming a lower electrode on the insulating layer including the plug wherein a surface of the lower electrode is irregular, forming a conductive layer covering the lower electrode, forming a dielectric layer on the conductive layer, and forming an upper electrode on the dielectric layer.

The present invention can be achieved in a whole or in parts by forming a contact hole by removing a predetermined portion of an insulating layer formed on a semiconductor substrate wherein the substrate has an impurity diffusion region and wherein the contact hole exposes a portion of the impurity diffusion region, forming an electrically-conductive plug filling up the contact hole wherein the plug is electrically connected to the impurity diffusion region, forming a lower electrode on the insulating layer including the plug wherein a surface of the lower electrode is irregular, forming a metal layer covering the lower electrode, forming a dielectric layer of $Ta_2O_5$ on the metal layer, and forming an upper electrode on the dielectric layer.

The present invention can be achieved in a whole or in parts by a capacitor in a semiconductor device and a fabricating method thereof which maintains the intrinsic dielectric constant of a dielectric layer and which increases an effective surface area of the capacitor by inserting a metal layer, such as a W layer and the like, between a storage electrode and the dielectric layer. This allows layers of materials such as $Ta_2O_5$, which have a high dielectric constant, to be used in such a capacitor.

The present invention can be achieved in whole or in part by a capacitor, comprising: a substrate; an insulating layer on the substrate, said insulating layer having a contact hole formed therethrough; an electrically conductive plug in the contact hole; a lower electrode on the insulating layer and on a surface of the electrically conductive plug, wherein a surface of the lower electrode is irregular; a metal layer covering the lower electrode; a dielectric layer on the metal layer; and an upper electrode on the dielectric layer.

The present invention may also be achieved in whole or in part by a method of fabricating a capacitor, comprising the steps of: forming a contact hole by removing a portion of an insulating layer formed on a substrate, wherein the substrate has an impurity diffusion region, and wherein the contact whole exposes at least a portion of the impurity diffusion region; forming an electrically conductive plug in the contact hole, wherein the electrically conductive plug is in electrical contact with the impurity diffusion region; forming a lower electrode on the insulting layer and the electrically conductive plug, said lower electrode having an irregular surface; forming a conductive layer on the lower electrode; forming a dielectric layer on the conductive layer; and forming an upper electrode on the dielectric layer.

The present invention may also be achieved in whole or in part by a capacitor comprising: a substrate; a first electrode formed over the substrate; a barrier to oxygen formed over the first electrode; a dielectric layer formed over the barrier to oxygen; and a second electrode formed over the dielectric layer.

The present invention may also be achieved in whole or in part by a method of fabricating a capacitor, comprising: forming a first electrode on a substrate; forming a dielectric layer on the electrode; and annealing the dielectric layer while substantially preventing an insulating material from forming between the first electrode and the dielectric layer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

The present invention, to provide an MIM structure using W, WN or the like as a lower electrode under a dielectric layer of $Ta_2O_5$, includes the steps of forming a storage electrode pattern by patterning an amorphous silicon layer, forming HSG on the storage electrode and forming a final storage electrode of W or substituted-W.

$Ta_2O_5$ or $BST(Ba_1Sr_{1-x} TiO_3)$ are desirable dielectric substances for a capacitor in a semiconductor device. However, an attempt to apply BST to a dielectric layer may fail due to the difficulty in the etch step used to form the electrode, and because CVD instruments for the deposition of a BST layer have not yet been developed. Thus, $Ta_2O_5$ is preferred over BST.

Deposited $Ta_2O_5$ typically consists of $Ta_2O_{5-x}$. In general, a storage electrode is formed with silicon, and a surface of the storage electrode is treated by nitrization to prevent leakage current and the like. A dielectric layer of $Ta_2O_5$ is deposited on the storage electrode, and the dielectric layer is annealed under oxygen ambience to form a uniform and homogeneous dielectric layer. The annealing step causes oxygen to penetrate into the silicon layer to form an oxide layer of $SiO_x$. The new insulating layer of silicon oxide increases the total thickness of the dielectric layer, thus reducing the capacitance of the resulting capacitor. In a capacitor formed according to the present invention, the penetration of oxygen into the silicon layer is prevented, the capacitance of the capacitor is secured, and the effective area of the capacitor is increased by inserting a metal layer of W or the like selectively between a surface of the storage electrode and the dielectric layer.

Figure 1:
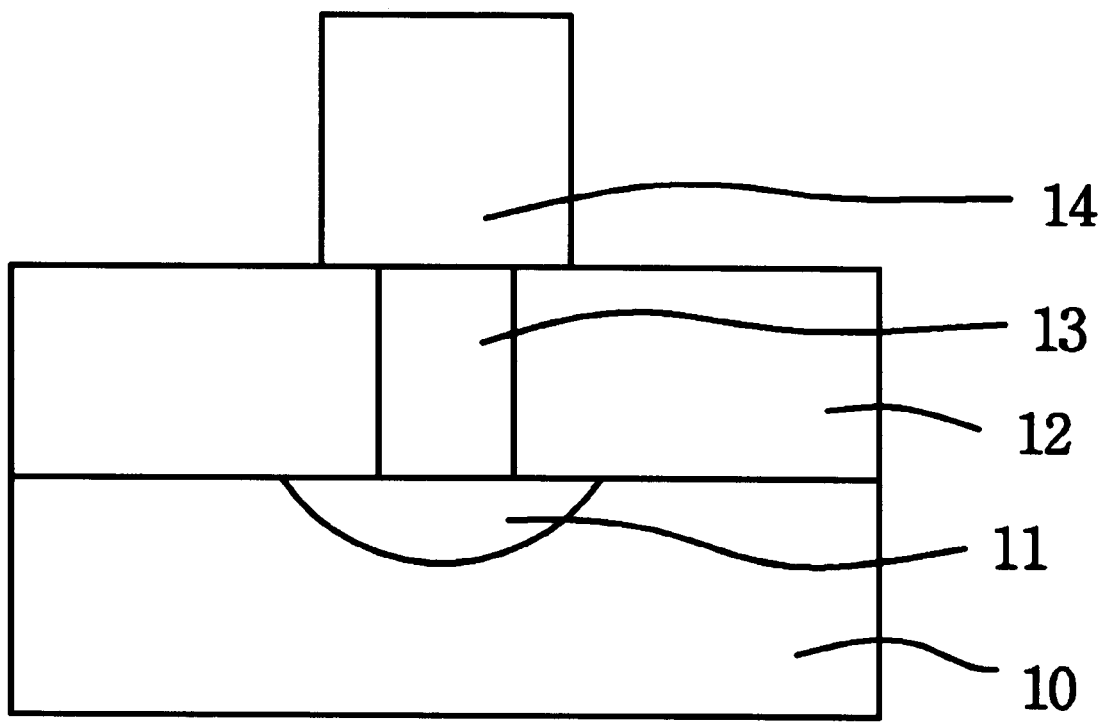
FIGS. 1–3 are cross-sectional views sequentially illustrating a related art method for forming a capacitor in a semiconductor device.
Figure 2:
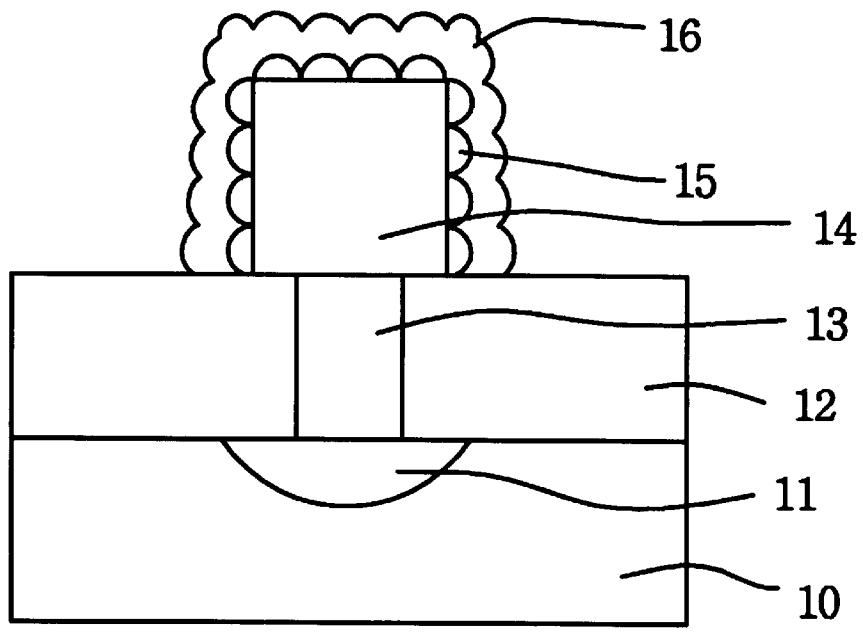
Figure 3:
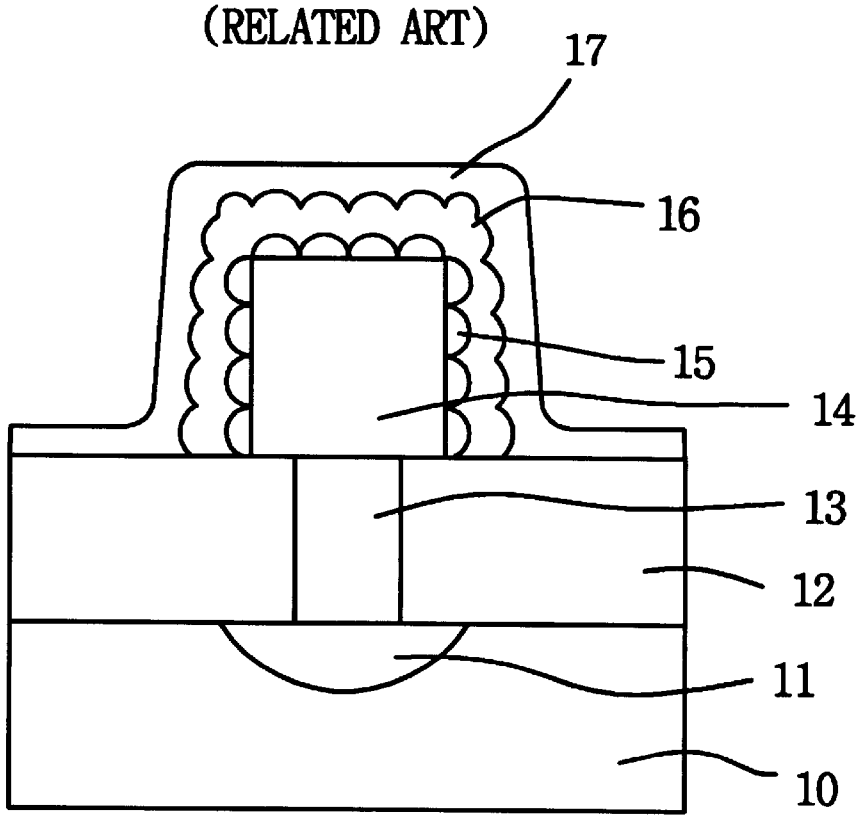
Figure 4:
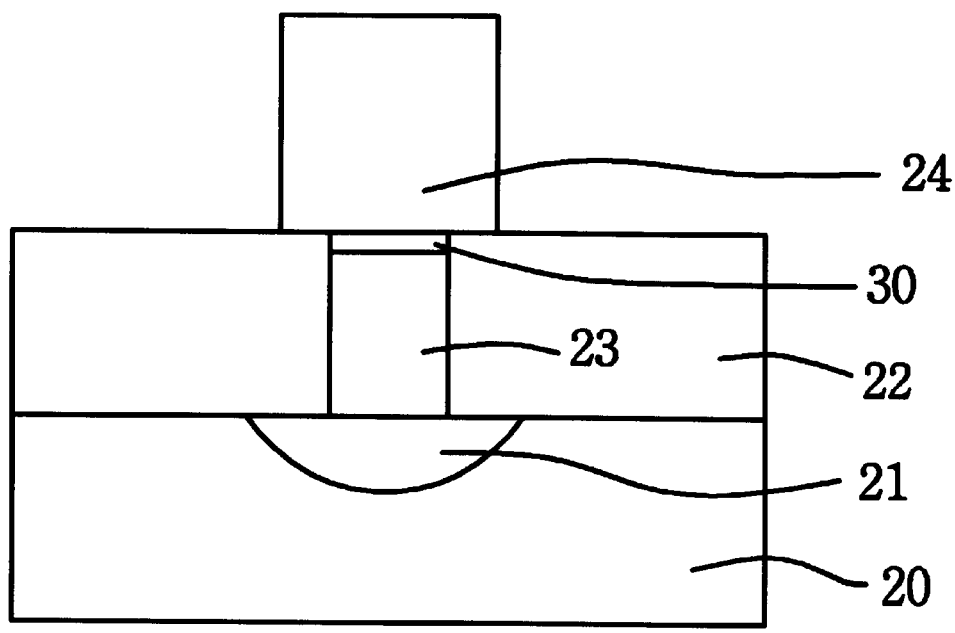
FIGS. 4–6 are cross-sectional views sequentially illustrating a method for forming a capacitor in a semiconductor device, in accordance with a preferred embodiment of the present invention.
Figure 5:
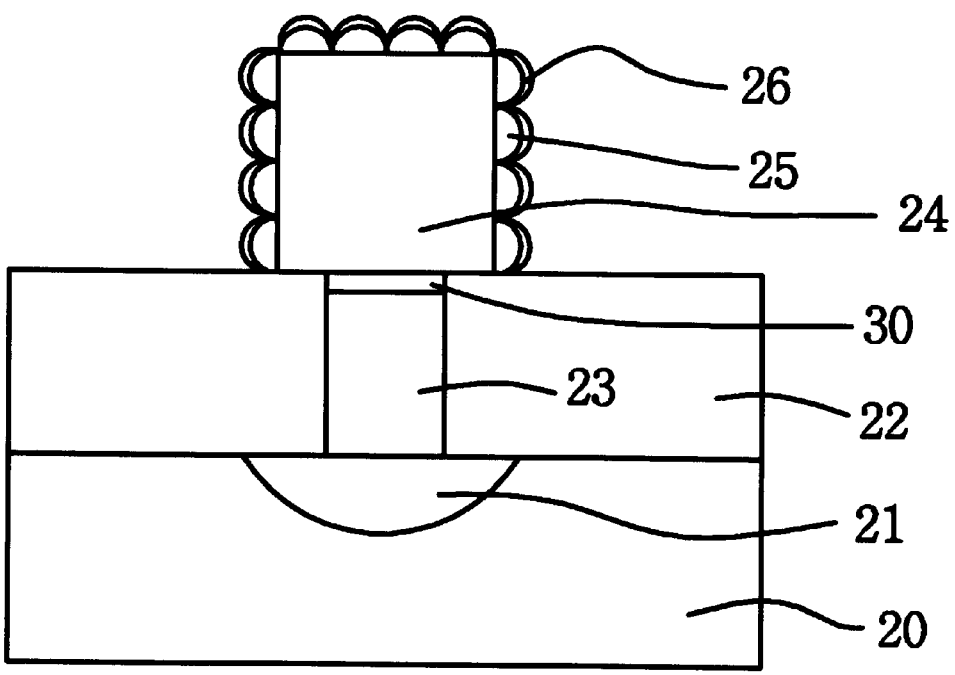
Figure 6:
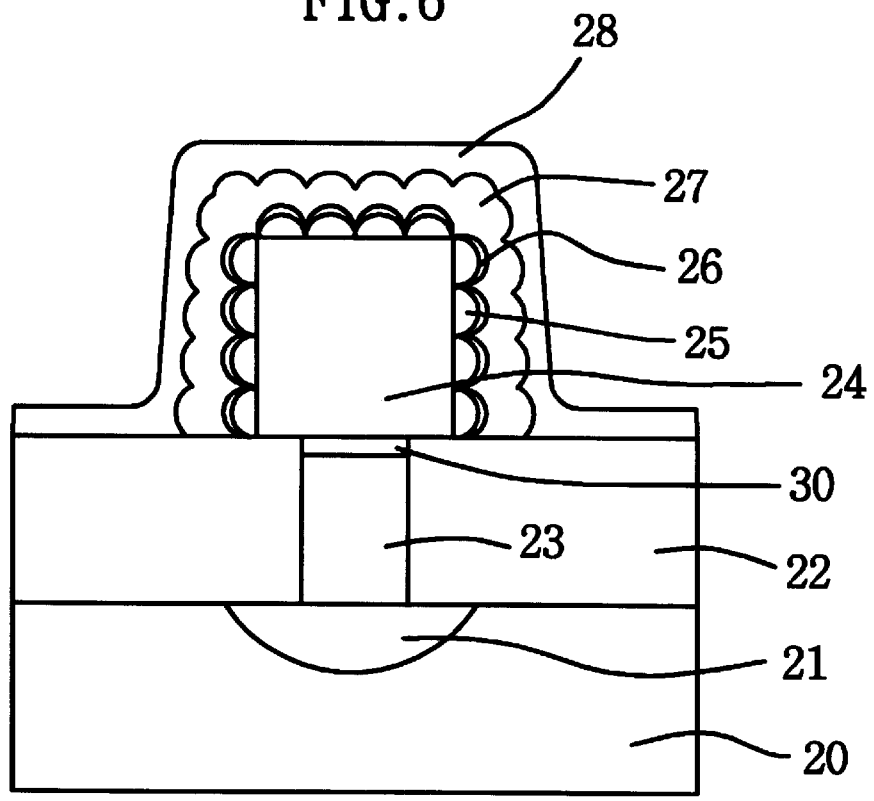

FIGS. 4–6 are cross-sectional views illustrating a method for forming a capacitor in a semiconductor device, in accordance with the present invention. Referring to FIG. 4, a gate insulator and a gate (not shown) are formed on a silicon substrate 20 formed from a p-type (first type) semiconductor. An impurity region 21, which could be the source or drain region of a transistor, is formed by doping predetermined portions of the substrate 20 with n-type (second type) impurities, such as As, P or the like. An insulating interlayer 22 is formed, preferably by depositing a silicon oxide layer 22 on the silicon substrate 20 by CVD.

After the insulating interlayer 22 has been coated with photoresist, a photoresist pattern (not shown) which exposes a predetermined surface portion of the insulating interlayer 22 which lies over the impurity region 21, is defined by exposure and development of the photoresist. Then, a contact hole that exposes a predetermined surface portion of the impurity region 21 is formed by etching the insulating interlayer 22 while using the photoresist pattern as an etch mask.

A conductive layer of W is formed by CVD on the insulating interlayer 22 to fill up the contact hole. A conductive plug 23, which is connected electrically to the impurity region 21 and fills up the contact hole, is formed by etching back the conductive layer of W until a surface of the insulating interlayer 22 is exposed. A barrier layer 30 may be optionally formed on the conductive plug 23 to prevent reaction between the conductive plug 23 material and a storage electrode. If a barrier layer 30 is used, it is preferably formed with one of TiN, Ti—Si—N, Ti—Al—N and the like, and is preferably recessed in the contact hole.

After an amorphous silicon layer doped with impurities has been deposited by CVD on the insulating interlayer 22, including the exposed surface of the conductive plug 23, a storage electrode 24 is patterned by etching the amorphous silicon layer anisotropically by photolithography. The storage electrode 24 may be formed in any suitable shape, including a box, cylinder, fin and the like. However, a box-type storage electrode is preferred due to design rules.

Referring to FIG. 5, the surface area of the storage electrode 24 is increased by making the surface irregular, preferably by selectively forming a plurality of hemispherical protruding parts 25 by carrying out a HSG formation step on the exposed surface of the storage electrode 24. As a result, a final storage electrode 24 and 25 is attained by the storage electrode 24 and the protruding parts 25. The hemispherical protruding parts 25 are preferably formed by flowing $SiH_4$ gas over the storage electrode 24 under the condition of vacuum state that ranges from approximately 1.0E(−7) Torr to approximately 5.0E(−8) Torr, thereby depositing hemispherical grains of silicon. Although hemispherical protruding parts 25 are formed in the preferred embodiment to increase the surface area of the storage electrode 24, other shapes that increase the surface area of the storage electrode 24 may be formed at the surface of the storage electrode 24 while still falling within the scope of the present invention.

A metal layer 26, preferably a selective-W layer, is formed over the final storage electrode 24 and 25, preferably by flowing $WF_6$ gas by a selective-W method over an incubation time. The selective-W layer 26 is preferably 50–200 Å thick and is preferably formed at a temperature 250–500° C. during an incubation time of approximately 3 to 20 minutes. Alternatively, the metal layer 26 may be formed by a selective-substituted W method or with a WN layer using $WF_6$ and $NH_3$. The metal layer 26, which becomes a part of the storage electrode 24, prevents oxygen from penetrating the silicon of the storage electrode during a subsequent annealing step performed under oxygen ambience. This improves the characteristics of the $Ta_2O_5$ dielectric layer.

Referring to FIG. 6, a dielectric layer 27 is formed on the metal layer 26 of W formed on the top surface of the storage electrode 24 and 25 preferably by depositing $Ta_2O_5$. Then, the characteristics of the dielectric layer 27 are improved by annealing the dielectric layer 27 under oxygen ambience. This is because the dielectric layer 27, which consists mainly of $Ta_2O_{5-x}$, needs to be saturated into $Ta_2O_5$ to provide an intrinsic dielectric constant.

The metal layer 26 prevents the generation of $SiO_x$ at the interface between the ;o* silicon storage electrode 24 and the dielectric layer 27. Thus, a decrease in the capacitance of the capacitor is prevented by not increasing the thickness of the dielectric layer 27. This is because the capacitance of the capacitor is proportional to the surface area of the dielectric layer 27, but inversely proportional to the thickness of the dielectric layer 27.

A plate electrode 28 of metal is formed on the insulating interlayer 22 including a surface of the dielectric layer 27, preferably by depositing a TiN layer. Thus, a capacitor with a MIS(metal-insulator-semiconductor) structure is fabricated.

Figure 7:
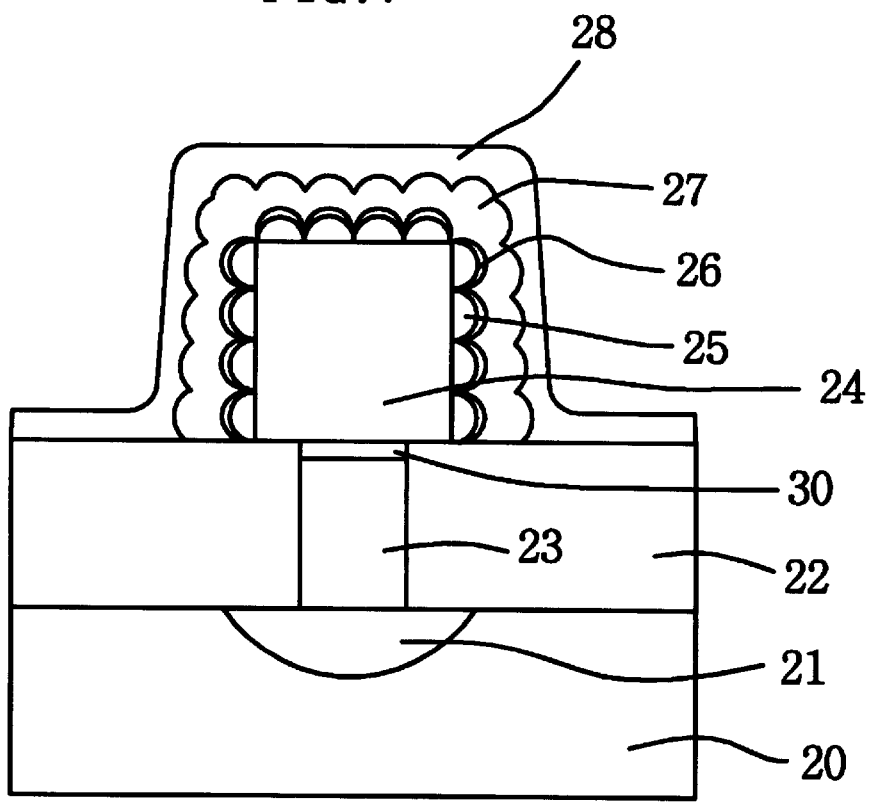
FIG. 7 is a cross-sectional view of a capacitor fabricated in accordance with the present invention.

FIG. 7 is a cross-sectional view of a capacitor fabricated in accordance with the present invention. Referring to FIG. 7, the capacitor comprises a silicon substrate 20 formed from a first type of semiconductor, an impurity region 21 at a predetermined portion of the substrate 20, an insulating interlayer 22, preferably silicon oxide, through which a contact hole exposing the impurity region 21. A conductive plug 23, preferably W, fills up the contact hole, and first and second portions of a lower electrode 24 and 25, which are in electrical contact with the conductive plug 23, are formed on the insulating layer 22. The second portion of the lower electrode comprises a plurality of hemispherical protruding parts. A third portion of the lower electrode 26 covers the second portion of the lower electrode 25. A dielectric layer 27, preferably $Ta_2O_5$, is formed on the third portion of the lower electrode 26, and an upper electrode 28, preferably a TiN layer, is formed on the dielectric layer 27. A barrier layer 30 may be positioned between the conductive plug 23 and the storage electrode 24 to prevent a reaction between the conductive plug 23 and the first portion of the lower electrode 24. The barrier layer 30, if used, is preferably recessed in the contact hole.

The third portion of the lower electrode 26 prevents oxygen from penetrating the second portion of the lower electrode 25. Thus, a decrease in the capacitance of the capacitor is prevented by preventing the generation of an oxide layer, which would increase the thickness of the dielectric layer 27. Accordingly, the present invention provides a storage electrode with a surface area that is maximized. The capacitance of the capacitor is excellent due to the dielectric layer 27. Further, a step difference between cell and peripheral areas is reduced because the capacitor has a metal-insulator-semiconductor structure.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method of fabricating a capacitor, comprising:
   forming a contact hole by removing a portion of an insulating layer formed on a substrate, wherein the substrate has an impurity diffusion region, and wherein the contact hole exposes at least a portion of the impurity diffusion region;
   forming an electrically conductive plug in the contact hole, wherein the electrically conductive plug is in electrical contact with the impurity diffusion region;
   forming a first electrode on the insulating layer and the electrically conductive plug;
   forming a tungsten (W) layer to a thickness of about 50 to 200 Å on the first electrode by flowing $WF_6$ gas at about 250 to 500° C. for about 3 to 20 minutes;
   forming a dielectric layer on the tungsten layer; and
   forming a second electrode on the dielectric layer.

2. The method of fabricating a capacitor according to claim 1, wherein the forming of the first electrode comprises:
   forming a first portion of the first electrode that is in electrical contact with an upper surface of the electrically conductive plug and that extends to a surface of the insulating layer; and
   forming a second portion of the first electrode on the first portion, said second portion electrode comprising a plurality of protruding parts.

3. The method of fabricating a capacitor according to claim 2, wherein the first portion of the first electrode is formed with doped silicon.

4. The method of fabricating a capacitor according to claim 2, wherein the protruding parts comprise hemispherical silicon grains.

5. The method of fabricating a capacitor according to claim 2, further comprising forming a barrier layer between the first portion of the first electrode and the electrically conductive plug.

6. The method of fabricating a capacitor according to claim 5, wherein the electrically conductive plug is formed so that it is recessed into the insulating layer, and wherein the barrier layer is formed on the electrically conductive plug.

7. The method of fabricating a capacitor according to claim 1, wherein the tungsten layer is formed with a substance which prevents oxygen penetration.

8. The method of fabricating a capacitor according to claim 1, wherein the forming of the dielectric layer comprises forming a layer of $Ta_2O_5$.

9. The method of fabricating a capacitor according to claim 1, wherein the forming of the second electrode comprises forming a layer of TiN.

10. The method of fabricating a capacitor according to claim 1, wherein the electrically conductive plug is formed with W.

11. A method of fabricating a capacitor, comprising:
    forming a first electrode over a substrate;
    forming a plurality of hemispherical protruding parts on the first electrode by flowing $SiH_4$ gas over the first electrode under a vacuum state that ranges from approximately 1.0E(−7) Torr to approximately 5.0E(−8) Torr;
    forming a dielectric layer over the first electrode including the plurality of hemispherical protruding parts;
    annealing the dielectric layer while substantially preventing an insulating material from forming between the first electrode and the dielectric layer; and
    forming a second electrode over the dielectric layer.

12. The method according to claim 4, wherein the dielectric layer comprises $Ta_2O_{5-x}$ before the annealing step.

13. The method according to claim 12, wherein the annealing of the dielectric layer while substantially preventing an insulating material from forming between the first electrode and the dielectric layer comprises:
    forming a barrier to oxygen between the first electrode and the dielectric layer; and
    annealing the dielectric layer in an oxygen atmosphere, wherein said barrier to oxygen prevents the formation of an oxide material between the first electrode and the dielectric layer during the annealing step.

14. The method according to claim 13, wherein the forming of the barrier to oxygen between the first electrode and the dielectric layer comprises forming a metal layer between the first electrode and the dielectric layer.

15. A method of fabricating a capacitor, comprising:
    forming a first electrode over a substrate;
    forming a plurality of hemispherical protruding parts on the first electrode by flowing $SiH_4$ gas over the first electrode under a vacuum state that ranges from approximately 1.0E(−7) Torr to approximately 5.0E(−8) Torr;
    forming a tungsten (W) layer to a thickness of about 50 to 200 Å on the first electrode including the plurality of hemispherical portions by flowing $WF_6$ gas at about 250 to 500° C. for about 3 to 20 minutes;
    forming a dielectric layer over the first electrode including the plurality of hemispherical portions and the tungsten layer; and
    forming a second electrode on the dielectric layer.

* * * * *